United States Patent
Katayama

(10) Patent No.: US 8,198,380 B2
(45) Date of Patent: Jun. 12, 2012

(54) COMPOSITION FOR THERMOSETTING SILICONE RESIN

(75) Inventor: Hiroyuki Katayama, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 152 days.

(21) Appl. No.: 12/717,161

(22) Filed: Mar. 4, 2010

(65) Prior Publication Data

US 2010/0225010 A1   Sep. 9, 2010

(30) Foreign Application Priority Data

Mar. 4, 2009   (JP) .................................. 2009-050995

(51) Int. Cl.
  *C08L 83/04* (2006.01)
  *C08G 77/14* (2006.01)

(52) U.S. Cl. .......... 525/477; 525/478; 525/479; 528/15; 528/31; 528/32; 528/37

(58) Field of Classification Search ........................ None
See application file for complete search history.

(56) References Cited

U.S. PATENT DOCUMENTS

| | | | |
|---|---|---|---|
| 4,880,882 A | 11/1989 | Morita et al. | |
| 5,310,843 A * | 5/1994 | Morita | 528/15 |
| 7,070,886 B2 * | 7/2006 | Cetin et al. | 430/2 |
| 2006/0111491 A1 | 5/2006 | Asch et al. | |
| 2006/0275617 A1 * | 12/2006 | Miyoshi et al. | 428/448 |
| 2009/0258216 A1 * | 10/2009 | Yamakawa et al. | 428/323 |

FOREIGN PATENT DOCUMENTS

| | | |
|---|---|---|
| JP | 2000-198930 A | 7/2000 |
| JP | 2004-186168 A | 7/2004 |
| JP | 2008-150437 A | 7/2008 |

OTHER PUBLICATIONS

Extended European Search Report dated Apr. 14, 2010 in corresponding European application No. 10155492.1.
Communication dated Mar. 26, 2012 from the State Intellectual Property Office of the People's Republic of China in counterpart Chinese application No. 201010129858.X.

* cited by examiner

*Primary Examiner* — Marc Zimmer
(74) *Attorney, Agent, or Firm* — Sughrue Mion, PLLC

(57) ABSTRACT

The present invention relates to a composition for a thermosetting silicone resin, the composition including: (A) an organohydrogenpolysiloxane; (B) an alkenyl group-containing epoxy compound; (C) an alkenyl group-containing cyclic siloxane; and (D) a hydrosilylation catalyst, a thermosetting silicone resin composition obtained by reacting the composition and a production method thereof, a photosemiconductor element-encapsulating material including the thermosetting silicone resin composition, and a photosemiconductor device including a photosemiconductor element encapsulated with the resin composition or the photosemiconductor element-encapsulating material.

8 Claims, No Drawings

COMPOSITION FOR THERMOSETTING SILICONE RESIN

FIELD OF THE INVENTION

The present invention relates to a composition for a thermosetting silicone resin. More particularly, the invention relates to a composition for a thermosetting silicone resin excellent in light transmitting property, adhesiveness, light resistance and heat resistance and having a high mechanical strength, a thermosetting silicone resin composition obtained by reacting the composition for a thermosetting silicone resin and a production method thereof, a photosemiconductor element-encapsulating material including the thermosetting silicone resin composition, and a photosemiconductor device including a photosemiconductor element encapsulated with the resin composition or the photosemiconductor element-encapsulating material.

BACKGROUND OF THE INVENTION

In high-intensity white LED devices whose application to generic illumination has been studied, the use of encapsulation materials having excellent light transmitting property, light resistance and heat resistance has been studied, rather than epoxy resins which have been widely used in conventional display LED devices. As such encapsulation materials, attention has been attracted to thermosetting silicone resins and modified materials thereof.

JP-A-2000-198930 discloses a resin composition excellent in light transmitting property and insulating characteristics, which is obtained by introducing an organopolysiloxane having a resin structure into an addition curing type silicone composition utilizing a hydrosilylation reaction to set the molar ratio of silicon-bonded hydrogen atoms/silicon-bonded alkenyl groups in the composition to a specific range.

JP-A-2004-126168 reports that an addition curing type silicone resin composition containing a silicone resin having at least two silicon atom-bonded alkenyl groups in one molecule thereof, an organohydrogensilane and/or an organohydrogenpolysiloxane having at least two silicon atom-bonded hydrogen atoms in one molecule thereof and an addition reaction catalyst as essential components provides a transparent cured material excellent in light transmitting property and discoloration resistance.

JP-A-2008-150437 reports that a cured material giving an excellent strength is obtained by using a straight-chain polyorganohydrogensiloxane having a silicon atom-bonded hydrogen atom (a Si—H group) midway of a molecular chain and a straight-chain polyorganohydrogensiloxane having a silicon atom-bonded hydrogen atoms (Si—H groups) at both ends of a molecular chain in specific amounts, in a photosemiconductor encapsulation silicone rubber composition containing a polyorganosiloxane having 0.2 or more silicon atom-bonded alkenyl group on average in one molecule thereof.

SUMMARY OF THE INVENTION

However, silicone resins essentially have the property of decomposing at high temperatures to produce cyclic oligosiloxanes. For this reason, in a photosemiconductor device encapsulated with the conventional silicone resin, the silicone resin is exposed to high-heat energy light emission to decompose, which causes a problem that the periphery of the device is contaminated, or that the light-emitting luminance decreases with time. Accordingly, it is not said to have enough light resistance and heat resistance.

Further, the silicone resin excellent in light resistance and heat resistance is generally weak in mechanical strength, so that there is also a problem that a chip cannot be sufficiently protected from external force or that tack remains on a surface to cause easy adhesion of dust.

An object of the invention is to provide a composition for a thermosetting silicone resin excellent in light transmitting property, adhesiveness, light resistance and heat resistance and having a high mechanical strength, a thermosetting silicone resin composition obtained by reacting the composition for a thermosetting silicone resin and a production method thereof, a photosemiconductor element-encapsulating material including the thermosetting silicone resin composition, and a photo semiconductor device including a photosemiconductor element encapsulated with the resin composition or the photosemiconductor element-encapsulating material.

Namely, the invention relates to the following (1) to (8).

(1) A composition for a thermosetting silicone resin, the composition including:
(A) an organohydrogenpolysiloxane;
(B) an alkenyl group-containing epoxy compound;
(C) an alkenyl group-containing cyclic siloxane; and
(D) a hydrosilylation catalyst.

(2) The composition for a thermosetting silicone resin according to (1), in which the (A) organohydrogenpolysiloxane is a compound represented by formula (I):

[Chem. 1]

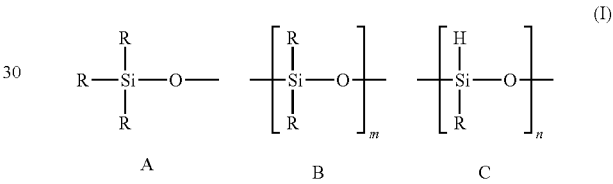

in which A, B and C are constitutional units, A represents a terminal unit, B and C each represents a repeating unit, R represents a monovalent hydrocarbon group having 1 to 20 carbon atoms or hydrogen, m represents an integer of 0 or 1 or more, and n represents an integer of 2 or more, provided that all R groups may be the same or different.

(3) The composition for a thermosetting silicone resin according to (1) or (2), in which, in the (B) alkenyl group-containing epoxy compound, a molar ratio (alkenyl group/epoxy group) of alkenyl groups and epoxy groups is from 10/1 to 0.1/1.

(4) The composition for a thermosetting silicone resin according to any one of (1) to (3), in which the (C) alkenyl group-containing cyclic siloxane is a compound having two or more alkenyl groups in the molecule thereof.

(5) A thermosetting silicone resin composition obtained by reacting (A) an organohydrogenpolysiloxane with (B) an alkenyl group-containing epoxy compound under the presence of (D) a hydrosilylation catalyst, and then, further reacting the resultant reacting product with (C) an alkenyl group-containing cyclic siloxane under the presence of (D) a hydrosilylation catalyst.

(6) A method for producing a thermosetting silicone resin composition, the method including:
a step of reacting (A) an organohydrogenpolysiloxane with (B) an alkenyl group-containing epoxy compound under the presence of (D) a hydrosilylation catalyst; and
a step of reacting the resultant reacting product with (C) an alkenyl group-containing cyclic siloxane under the presence of (D) a hydrosilylation catalyst.

(7) A photosemiconductor element-encapsulating material including the thermosetting silicone resin composition according to (5).

(8) A photosemiconductor device including a photosemiconductor element encapsulated with the thermosetting silicone resin composition according to (5) or the photosemiconductor element-encapsulating material according to (7).

The composition for a thermosetting silicone resin of the invention exhibits an excellent effect of being able to provide a thermosetting silicone resin composition excellent in light transmitting property, adhesiveness, light resistance and heat resistance and having a high mechanical strength.

DETAILED DESCRIPTION OF THE INVENTION

The composition for a thermosetting silicone resin of the invention includes (A) an organohydrogenpolysiloxane, (B) an alkenyl group-containing epoxy compound, (C) an alkenyl group-containing cyclic siloxane and (D) a hydrosilylation catalyst.

The organohydrogenpolysiloxane is a silicone resin derivative excellent in light transmitting property, light resistance and heat resistance, and resinified by an addition reaction of a hydrosilyl group (Si—H group) with an unsaturated bond-containing group such as an alkenyl group. In the invention, the alkenyl group-containing epoxy compound and the alkenyl group-containing cyclic siloxane are used together as compounds having the unsaturated bond-containing group. An epoxy group is introduced into a skeleton, and the cyclic siloxane acts as a crosslinking point, by reacting the above-mentioned both compounds, respectively, with the organohydrogenpolysiloxane. Thus, characteristics such as light transmitting property, light resistance and heat resistance essentially possessed by the organohydrogenpolysiloxane can be more improved, although a detailed reason therefor is not clear. Further, an epoxy structure in the alkenyl group-containing epoxy compound can impart adhesiveness by flexible structure thereof, and a cyclic siloxane of the alkenyl group-containing cyclic siloxane can improve the elastic modulus of a cured material to impart mechanical strength, because it has a rigid structure compared to a straight-chain siloxane. It is therefore considered that the resin composition obtained by reacting the flexible epoxy structure and the rigid cyclic siloxane, respectively, with the organohydrogenpolysiloxane excellent in light transmitting property, light resistance and heat resistance is excellent in light transmitting property, light resistance and heat resistance, moreover, excellent in adhesiveness, and also has a high mechanical strength.

Constituents of the invention will be described below.

(A) Organohydrogenpolysiloxane

The organohydrogenpolysiloxane in the invention is preferably a compound represented by formula (I):

[Chem. 2]

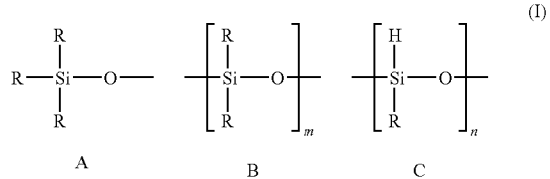

in which A, B and C are constitutional units, A represents a terminal unit, B and C each represents a repeating unit, R represents a monovalent hydrocarbon group having 1 to 20 carbon atoms or hydrogen, m represents an integer of 0 or 1 or more, and n represents an integer of 2 or more, provided that all R groups may be the same or different.

The compound represented by formula (I) is a compound constituted by constitutional units A, B and C, in which A is a terminal unit, B and C are a repeating unit, and hydrogen is necessarily contained in constitutional unit C.

R groups in formula (I), that is to say, all of R in constitutional unit A, R in constitutional unit B and R in constitutional unit C represent a monovalent hydrocarbon group having 1 to 20 carbon atoms or hydrogen. As the hydrocarbon groups, saturated or unsaturated, straight-chain, branched or cyclic hydrocarbon groups may be mentioned. The carbon number thereof is preferably from 1 to 20, and more preferably from 1 to 10, from the viewpoints of availability and economy. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group is preferred from the viewpoints of light transmitting property and light resistance of the cured material. Incidentally, in formula (I), all R groups may be the same or different, and each independently represents the above-mentioned hydrocarbon group or hydrogen, regardless of the constitutional unit.

The constitutional unit A is the terminal unit, and two units are contained in formula (I).

The repeating unit number of the constitutional unit B, that is to say, m in formula (I), represents an integer of 0 or 1 or more. From the viewpoints of reactivity and stability, it is preferably an integer of 1 to 1,000, and more preferably an integer of 1 to 100.

The repeating unit number of the constitutional unit C, that is to say, n in formula (I), represents an integer of 2 or more. From the viewpoints of reactivity and stability, it is preferably an integer of 2 to 10,000, and more preferably an integer of 2 to 1,000.

The stun of m and n is preferably from 2 to 10,000, and more preferably from 2 to 2,000. Further, the ratio of m to n (m/n) is preferably from 1,000/1 to 1/1,000, and more preferably from 100/1 to 1/100.

Examples of such compounds represented by formula (I) include a a dimethylpolysiloxane-CO-methylhydrogenpolysiloxane, an ethylhydrogenpolysiloxane and a methylhydrogenpolysiloxane-CO-methylphenylpolysiloxane. These can be used either alone or as a combination of two or more thereof. Of theses, preferred are a compound in which R is a methyl group, m is an integer of 1 or more, and n is an integer of 2 or more.

The molecular weight of the compound represented by formula (I) is preferably from 100 to 1,000,000, and more preferably from 100 to 100,000, from the viewpoints of stability and handling properties.

The content of the compound represented by formula (I) in the organohydrogenpolysiloxane is preferably 50% by weight or more, more preferably 80% by weight or more and still more preferably substantially 100% by weight.

The content of the organohydrogenpolysiloxane is preferably from 0.1 to 99% by weight, more preferably from 0.1 to 90% by weight and still more preferably from 0.1 to 80% by weight, in the composition.

(B) Alkenyl Group-Containing Epoxy Compound

The alkenyl group-containing epoxy compound is not particularly limited, as long as it is a compound having an alkenyl group and an epoxy group in the molecule thereof. However, from the viewpoints of reactivity and handling properties, the molar ratio (alkenyl group/epoxy group) of alkenyl groups and epoxy groups is preferably from 10/1 to 0.1/1, more preferably from 3/1 to 0.3/1, and still more preferably substantially equivalent (1/1).

As the alkenyl groups, substituted and unsubstituted alkenyl groups may be mentioned, and they may be any as long as they are an organic group containing an alkenyl group in their skeleton. The carbon number of the organic group is preferably from 1 to 20, and more preferably from 1 to 10, from the viewpoints of ease of preparation and heat resistance. Specifically, there are exemplified a vinyl group, an allyl group, a propenyl group, a butenyl group, a pentenyl group, a hexenyl group, a heptenyl group, an octenyl group, a norbornenyl, a cyclohexenyl group and the like. Above all, a vinyl group is preferred from the viewpoint of reactivity to a hydrosilylation reaction.

Preferred examples of compounds having such structures are shown below:

[Chem. 3]

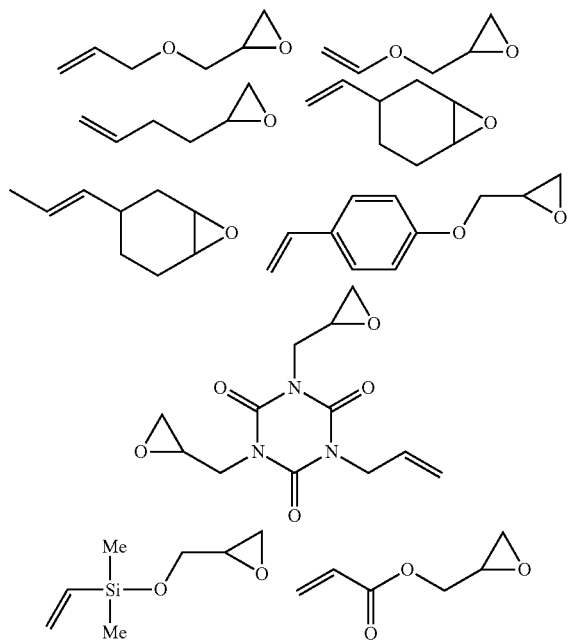

Of the above-mentioned compounds, allyl(glycidyl)ether and vinylcyclohexene oxide are more preferred from the viewpoints of availability and reactivity.

The content of the alkenyl group-containing epoxy compound is preferably from 0.01 to 50% by weight, more preferably from 0.01 to 20% by weight, and still more preferably from 0.1 to 10% by weight, in the composition, from the viewpoints of strength and adhesiveness of the resin obtained.

Further, the alkenyl group-containing epoxy compound is desirably contained in such an amount that the molar ratio (SiH group/alkenyl group) of the above-mentioned functional groups becomes preferably 10/0.5 to 10/5, more preferably 10/2 to 10/4, because alkenyl groups thereof react with SiH groups of the organohydrogenpolysiloxane. When the above-mentioned molar ratio is 10/0.5 or more, an effect of improving adhesiveness by the epoxy group becomes better. When it is 10/5 or less, heat resistance is not impaired.

(C) Alkenyl Group-Containing Cyclic Siloxane

As the alkenyl group-containing cyclic siloxane, preferred is a 4- to 16-membered cyclic siloxane having two or more silicon atom-bonded alkenyl groups in the molecule thereof. Incidentally, the silicon atoms to which the alkenyl groups are bonded may be the same or different.

As the alkenyl groups, there are exemplified the same alkenyl groups as described above, and there is no particular limitation thereon. However, from the viewpoint of reactivity to the hydrosilylation reaction, a vinyl group is preferred.

Substituent groups on silicon other than the alkenyl group each independently include a monovalent hydrocarbon group having 1 to 20 carbon atoms. The hydrocarbon group is saturated or unsaturated, straight-chain, branched or cyclic, and the carbon number thereof is preferably from 1 to 20, and more preferably from 1 to 10, from the viewpoints of availability and economy. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group is preferred from the viewpoints of light transmitting property and light resistance of the cured material.

Preferred examples of compounds having such structures are shown below:

[Chem. 4]

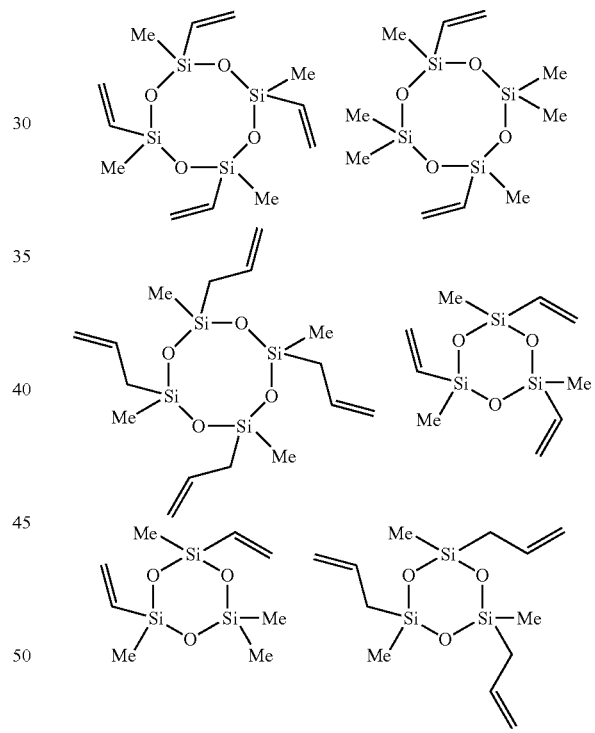

Of the above-mentioned compounds, 1,3,5,7-tetravinyl-1,3,5,7-tetramethylcyclotetrasiloxane is more preferred from the viewpoints of availability and reactivity.

The content of the alkenyl group-containing cyclic siloxane is preferably from 0.01 to 60% by weight, more preferably from 0.01 to 40% by weight, and still more preferably from 0.1 to 20% by weight, in the composition, from the viewpoints of strength and heat resistance of the resin obtained.

Further, the alkenyl group-containing cyclic siloxane is desirably contained in such an amount that the molar ratio (SiH group/total alkenyl group) of SiH groups and total alkenyl groups of the alkenyl group-containing epoxy compound and the alkenyl group-containing cyclic siloxane becomes preferably 10/5 to 10/20, more preferably substantially equivalent (10/10), because alkenyl groups thereof react with SiH groups of the organohydrogenpolysiloxane, and the SiH groups also react with alkenyl groups of the alkenyl group-containing epoxy compound. When the above-mentioned molar ratio is 10/20 or less, heat resistance is not impaired by unreacted alkenyl groups. Further, when it is 10/5 or more, crosslinking of the composition is kept to show a sufficient mechanical strength.

(D) Hydrosilylation Catalyst

There is no particular limitation on the hydrosilylation catalyst in the invention, as long as it is a compound which catalyzes a hydrosilylation reaction of a hydrosilane compound and an aerie. There are exemplified platinum catalysts such as platinum black, platinum chloride, chloroplatinic acid, a platinum-olefin complex such as a platinum-1,3-divinyl-1,1,3,3-tetramethyldisiloxane complex, a platinum-carbonyl complex and platinum-acetyl acetate; palladium catalysts; rhodium catalysts; and the like. Above all, a platinum-olefin complex is preferred, and a platinum-1,3-divinyl-1,1,3,3-tetramethyldisiloxane complex is more preferred, from the viewpoints of compatibility, light transmitting property and catalytic activity.

Further, in the invention, although both the reaction of the organohydrogenpolysiloxane with the alkenyl group-containing epoxy compound and the reaction of organohydrogenpolysiloxane with the alkenyl group-containing cyclic siloxane are the hydrosilylation reaction, it is preferred that the same hydrosilylation catalyst is used in the respective reactions.

For example, when the platinum catalyst is used, the total content of hydrosilylation catalyst in the composition is adjusted so that the platinum content becomes preferably $1.0 \times 10^{-4}$ to 0.5 part by weight, more preferably $1.0 \times 10^{-4}$ to $1.0 \times 10^{-2}$ part by weight, based on 100 parts by weight of the organohydrogenpolysiloxane, from the viewpoint of reaction rate. When the platinum content is $1.0 \times 10^{-4}$ part by weight or more, the reaction rate is good. When it is 0.5 part by weight or less, the resulting composition does not turn yellow.

The composition for a thermosetting silicone resin of the invention may contain additives such as an antioxidant, a modifying agent, a surfactant, a dye, a pigment, a discoloration preventing agent and an ultraviolet absorber, in addition to the above, within the range not impairing the effects of the invention.

The composition for a thermosetting silicone resin of the invention can be prepared without any particular limitation, as long as the composition includes respective components of the (A) organohydrogenpolysiloxane, the (B) alkenyl group-containing epoxy compound, the (C) alkenyl group-containing cyclic siloxane and the (D) hydrosilylation catalyst. However, from the viewpoint of more improving both characteristics of heat resistance and mechanical strength of the thermosetting silicone resin composition obtained by reacting the composition of the invention, the alkenyl group-containing epoxy compound may be preliminarily mixed with the organohydrogenpolysiloxane, followed by mixing of the alkenyl group-containing cyclic siloxane. Incidentally, the hydrosilylation catalyst may be added at the time when any component is mixed. However, it is preferred that the hydrosilylation catalyst is added when the alkenyl group-containing epoxy compound is mixed with the organohydrogenpolysiloxane, followed by mixing together. Further, when the alkenyl group-containing cyclic siloxane is mixed, the hydrosilylation catalyst may be further additionally mixed.

Mixing of the organohydrogenpolysiloxane and the alkenyl group-containing epoxy compound can be performed by stirring under the presence of the hydrosilylation catalyst, preferably at 20 to 150° C., more preferably at 70 to 100° C., for 5 minutes to 24 hours.

Incidentally, the addition reaction of the SiH groups of the organohydrogenpolysiloxane and the alkenyl groups of the alkenyl group-containing epoxy compound may be partially initiated by the above-mentioned mixing, and the degree of progress of the condensation reaction can be confirmed by the degree of disappearance of a peak derived from the alkenyl group of the alkenyl group-containing epoxy compound by $^1$H-NMR measurement.

Then, the alkenyl group-containing cyclic siloxane is mixed with the mixture obtained above. There is no particular limitation on a mixing method, as long as uniform mixing is performed.

Thus, the thermosetting silicone resin composition of the invention is obtained. The thermosetting silicone resin composition provides the cured material excellent in light transmitting property, adhesiveness, light resistance and heat resistance and having a high mechanical strength, so that the invention also provides the photosemiconductor element-encapsulating material containing the thermosetting silicone resin composition of the invention.

The thermosetting silicone resin composition or the photosemiconductor element-encapsulating material of the invention can form an encapsulation layer, for example, on a light-emitting diode (LED) element, an organic electroluminescence (organic EL) element, a laser diode, a LED array or the like by potting it as such or transfer molding it.

Further, the composition for a thermosetting silicone resin of the invention is resinified by performing the hydrosilylation reaction of the organohydrogenpolysiloxane and the two kinds of alkenyl group-containing compounds, so that it is considered that a molded product in a semi-cured state can be prepared by controlling the reaction utilizing the difference in reactivity between the respective alkenyl group-containing compounds, and the like. Accordingly, the composition for a thermosetting silicone resin of the invention is applied, for example, to an appropriate thickness onto a release sheet (for example, a polyethylene substrate) whose surface is release treated, by a method such as casting, spin coating or roll coating, and dried by heating at such a temperature that the solvent is removable, thereby forming a sheet in the semi-cured state (stage B state). This sheet can be provided as the photosemiconductor element-encapsulating material. Such a sheet is the photosemiconductor element-encapsulating material which is laminated on photosemiconductor elements to be able to encapsulate the LED elements in a lump.

The heating temperature is not necessarily determined according to the kind of solvent used. However, in the composition of the invention, this heating completes part of the hydrosilylation reaction, that is to say, the reaction of the organohydrogenpolysiloxane and the alkenyl group-containing epoxy compound, to prepare the silicone resin sheet in the semi-cured state, in addition to removal of the solvent, so that the heating temperature is preferably from 20 to 150° C., and more preferably from 40 to 100° C. The heating time is preferably from 0.1 to 24 hours. Incidentally, in this specification, "completion of the reaction" means the case where 80% or more of functional groups responsible for the reaction have reacted, and in the reaction of the organohydrogenpolysiloxane and the alkenyl group-containing epoxy compound, it can be confirmed by measuring, for example, the amount of residual alkenyl groups of the alkenyl group-containing epoxy compound by $^1$H-NMR described above.

The resulting sheet is in the semi-cured state, so that, for example, the sheet is laminated as such on the photosemiconductor elements, followed by performing encapsulation processing, and thereafter, the sheet is completely cured by heating at high temperature, thereby being able to prepare a photosemiconductor device. This complete curing of the sheet is performed by the reaction of the organohydrogenpolysiloxane and the alkenyl group-containing cyclic siloxane.

There is no particular limitation on a method for laminating the sheet on the substrate, followed by performing encapsulation processing. For example, there is exemplified a method of pressing the sheet on the substrate by heating preferably at 100 to 200° C. and 0.01 to 10 MPa, more preferably at 120 to 160° C. and 0.1 to 1 MPa, for 5 to 600 seconds, using a laminator, and then, performing encapsulation processing.

The heating temperature of the encapsulation processing is preferably from 60 to 200° C., and more preferably from 100 to 150° C. The heating time is preferably from 0.5 to 48 hours, and more preferably from 1 to 8 hours.

Incidentally, the progress degree of the reaction of the organohydrogenpolysiloxane and the alkenyl group-containing cyclic siloxane can be confirmed, for example, by the degree of absorption of a peak derived from the SiH group of the organohydrogenpolysiloxane, according to IR measurement. When the absorption intensity is less than 20% of an initial value (before the curing reaction), the hydrosilylation reaction can be judged to be completed to accomplish complete curing.

Further, although the thermosetting silicone resin composition of the invention can be used by curing the composition for a thermosetting silicone resin of the invention as described above, it is preferably one obtained by reacting (A) an organohydrogenpolysiloxane with (B) an alkenyl group-containing epoxy compound under the presence of (D) a hydrosilylation catalyst (reaction (1)), and then, further reacting the resultant reaction product with (C) an alkenyl group-containing cyclic siloxane under the presence of (D) hydrosilylation catalyst (reaction (2)), from the viewpoint of compatibility of heat resistance and mechanical strength of the cured material.

Specifically, reaction (1) can be performed by stirring the (A) organohydrogenpolysiloxane and the (B) alkenyl group-containing epoxy compound under the presence of the (D) hydrosilylation catalyst. The hydrosilylation catalyst is essential for the above-mentioned reaction, so that it is preferably added from the start of reaction (1). There is no particular limitation on the amount thereof added, as long as it is an amount sufficient to the above-mentioned reaction.

The reaction temperature of reaction (1) is preferably from 20 to 150° C., and more preferably from 40 to 100° C., from the viewpoint of reactivity of the (A) organohydrogenpolysiloxane and the (B) alkenyl group-containing epoxy compound. The reaction time is preferably from 0.1 to 24 hours, and more preferably from 0.5 to 6 hours. The reaction of the organohydrogenpolysiloxane with the alkenyl group-containing epoxy compound is completed by performing the reaction under the above-mentioned conditions. The progress of reaction (1) can be confirmed by measuring the amount of residual alkenyl groups of the alkenyl group-containing epoxy compound by $^1$H-NMR.

Then, the reaction product of reaction (1) and the alkenyl group-containing cyclic siloxane (C) are reacted. Specifically, there is an embodiment (reaction (2)) in which the reaction product of the above-mentioned reaction (1) and the (C) alkenyl group-containing cyclic siloxane are stirred under the presence of the hydrosilylation catalyst to react them. The hydrosilylation catalyst is also essential in reaction (2), so that it may be either added from the time of reaction (1) or newly added at the start of reaction (2), as long as it is present at the time of stirring in reaction (2). There is no particular limitation on the amount thereof added, as long as it is an amount sufficient to reaction (2).

The reaction temperature of reaction (2) is preferably from 20 to 250° C., and more preferably from 100 to 200° C., from the viewpoint of reactivity of the reaction product of reaction (1) and the alkenyl group-containing cyclic siloxane (C). The reaction time is preferably from 0.1 to 48 hours, and more preferably from 0.5 to 24 hours. The reaction under the above-mentioned conditions allows the alkenyl group-containing cyclic siloxane to be further added to the organohydrogenpolysiloxane. The progress of reaction (2) can be confirmed by the degree of absorption of a peak derived from the SiH group of the organohydrogenpolysiloxane, according to IR measurement.

Further, the present invention provides a method for producing a thermosetting silicone resin composition including a step (step (1)) of reacting (A) an organohydrogenpolysiloxane with (B) an alkenyl group-containing epoxy compound under the presence of (D) a hydrosilylation catalyst, and a step (step (2)) of reacting the resultant reaction product obtained in the above-mentioned step (1) with (C) an alkenyl group-containing cyclic siloxane under the presence of (D) a hydrosilylation catalyst.

Specific examples of step (1) include, for example, a step of stirring the (A) organohydrogenpolysiloxane and the (B) alkenyl group-containing epoxy compound under the presence of the (D)hydrosilylation catalyst, preferably at 20 to 150° C., more preferably at 40 to 100° C., preferably for 0.1 to 24 hours, more preferably for 0.5 to 6 hours to react them, and the like. The hydrosilylation catalyst is essential for the above-mentioned reaction, so that it is preferably added from the start of the reaction. There is no particular limitation on the amount thereof added, as long as it is an amount sufficient to the above-mentioned reaction.

Specific examples of step (2) include, for example, a step of stirring the reaction product obtained in reaction (1) and the (C) alkenyl group-containing cyclic siloxane under the presence of the (D) hydrosilylation catalyst, preferably at 20 to 250° C., more preferably at 100 to 200° C., preferably for 0.1 to 48 hours, more preferably for 0.5 to 24 bows to react them, and the like. The hydrosilylation catalyst is also essential for the reaction of step (2), so that it may be either added from the time of reaction (1) or newly added at the start of reaction (2), as long as it is present at the time of the reaction of step (2). There is no particular limitation on the amount thereof added, as long as it is an amount sufficient to the reaction of step (2).

The thermosetting silicone resin composition of the invention thus obtained is excellent in light transmitting property, adhesiveness, light resistance and heat resistance and has a high mechanical strength, so that it can be utilized as an encapsulation material for a high-intensity LED device. Further, it is excellent in heat degradation resistance, so that a decrease in luminance or contamination of the device is difficult to occur, even when the LED device is used for a long period of time.

Accordingly, the invention provides the photosemiconductor device in which the photosemiconductor elements are encapsulated by using the thermosetting silicone resin composition of the invention or the above-mentioned photosemiconductor element-encapsulating material.

The photosemiconductor device of the invention can be produced by encapsulating the LED elements by using the thermosetting silicone resin composition of the invention as the photosemiconductor element-encapsulating material. Specifically, the thermosetting silicone resin composition of the invention or the above-mentioned photosemiconductor element-encapsulating material is applied to an appropriate thickness onto the substrate on which the LED elements are mounted, as such by a method such as potting or transfer molding or by a method such as casting, spin coating or roll coating to cover the LED elements, followed by heating and drying, thereby being able to produce the photosemiconductor device.

The photosemiconductor device of the invention contains as the photosemiconductor element-encapsulating material the thermosetting silicone resin composition excellent in light transmitting property, adhesiveness, light resistance and heat resistance and having a high mechanical strength, so that it may be a photosemiconductor device on which blue or white LED elements are mounted.

EXAMPLES

The invention will be described below with reference to examples and comparative examples, but the invention is not construed as being limited thereto.

Molecular Weight of Silicone Derivative

The molecular weight is determined in terms of polystyrene by gel permeation chromatography (GPC).

Example 1

To a mixture of 20 g of an organohydrogenpolysiloxane (a compound represented by formula (I) in which R groups are all methyl groups, m is 40 and n is 4, average molecular weight 3,400, SiH group equivalent: 1.2 mmol/g) and 0.92 g (8.1 mmol, the molar ratio (alkenyl group/epoxy group) of alkenyl groups and epoxy groups=1/1, the molar ratio (SiH group/alkenyl group) of SiH groups of the organohydrogenpolysiloxane and alkenyl groups of the alkenyl group-containing epoxy compound=10/3.4) of allyl(glycidyl)ether, 50 mg (platinum content: $0.5 \times 10^{-2}$ part by weight based on 100 parts by weight of the organohydrogenpolysiloxane) of a platinum-1,3-divinyl-1,1,3,3-tetramethyldisiloxane complex solution (platinum concentration: 2% by weight) was added as a hydrosilylation catalyst, followed by stirring at 80° C. for 1 hour. As a result of $^{1}$H-NMR measurement of a transparent and colorless oil thus obtained, no peak relating to the residual alkenyl group amount of allyl(glycidyl)ether was observed, and it was confirmed that the reaction was completed.

Then, 1.4 g (4.1 mmol, the molar ratio (SiH group/total alkenyl group) of SiH groups of the organohydrogenpolysiloxane and total alkenyl groups of the alkenyl group-containing epoxy compound and the alkenyl group-containing cyclic siloxane=10/10) of 1,3,5,7-tetravinyl-1,3,5,7-tetramethylcyclotetrasiloxane was added to the oil obtained above, followed by stirring. Thereafter, the resulting solution was applied on a biaxially oriented polyester film (manufactured by Mitsubishi Chemical Polyester Film Co., Ltd., 50 μm) to a thickness of 400 μm, and heated at 100° C. for 2 hours and at 150° C. for 5 hours to prepare a resin composition (completely cured material).

Further, using the solution before coating on the biaxially oriented polyester film in the above, blue LEDs were encapsulated by potting, followed by heating at 100° C. for 2 hours and at 150° C. for 5 hours to prepare a LED device.

Example 2

The preparation of a resin composition and the production of a LED device were performed in the same manner as in Example 1, with the exceptions that the amount of allyl(glycidyl)ether was changed from 0.92 g (8.1 mmol) to 0.55 g (4.8 mmol, the molar ratio (SiH group/alkenyl group) of SiH groups of the organohydrogenpolysiloxane and alkenyl groups of the alkenyl group-containing epoxy compound=10/2), and that the amount of 1,3,5,7-tetravinyl-1,3,5,7-tetramethylcyclotetrasiloxane was changed from 1.4 g (4.1 mmol) to 1.6 g (4.6 mmol, the molar ratio (SiH group/total alkenyl group) of SiH groups of the organohydrogenpolysiloxane and total alkenyl groups of the alkenyl group-containing epoxy compound and the alkenyl group-containing cyclic siloxane=10/9.7).

Example 3

The preparation of a resin composition and the production of a LED device were performed in the same manner as in Example 1, with the exception that 73 g of an organohydrogenpolysiloxane (a compound represented by formula (I) in which R groups are all methyl groups, m is 160 and n is 4, average molecular weight: 12,300, SiH group equivalent: 0.33 mmol/g) was used in place of the organohydrogenpolysiloxane (the compound represented by formula (I) in which R groups are all methyl groups, m is 40 and n is 4, average molecular weight: 3,400, SiH group equivalent: 1.2 mmol/g). Incidentally, the molar ratio (SiH group/alkenyl group) of SiH groups of the organohydrogenpolysiloxane and alkenyl groups of the alkenyl group-containing epoxy compound was 10/3.4, and the molar ratio (SiH group/total alkenyl group) of SiH groups of the organohydrogenpolysiloxane and total alkenyl groups of the alkenyl group-containing epoxy compound and the alkenyl group-containing cyclic siloxane was 10/10.

Example 4

The preparation of a resin composition and the production of a LED device were performed in the same manner as in Example 1, with the exception that 1.0 g (8.1 mmol, the molar ratio (alkenyl group/epoxy group) of alkenyl groups and epoxy groups=1/1, the molar ratio (SiH group/alkenyl group) of SiH groups of the organohydrogenpolysiloxane and alkenyl groups of the alkenyl group-containing epoxy compound=10/3.4) of vinylcyclohexene oxide was used in place of 0.92 g (8.1 mmol) of allyl(glycidyl)ether.

Comparative Example 1

To a mixture of 20 g of an organohydrogenpolysiloxane (a compound represented by formula (I) in which R groups are all methyl groups, m is 40 and n is 4, average molecular weight: 3,400, SiH group equivalent: 1.2 mmol/g) and 9.6 g of methylvinylpolysiloxane (average molecular weight; 3,200, vinyl group equivalent: 2.5 mmol/g), 50 mg (platinum content $0.5 \times 10^{-2}$ part by weight based on 100 parts by weight of the organohydrogenpolysiloxane) of a platinum-1,3-divinyl-1,1,3,3-tetramethyldisiloxane complex solution (platinum concentration: 2% by weight) was added as a hydrosilylation catalyst, followed by stirring. Thereafter, the resulting solution was applied on a biaxially oriented polyester film (manufactured by Mitsubishi Chemical Polyester Film Co., Ltd., 50 μm) to a thickness of 400 μm, and heated at 100° C. for 2 hours and at 150° C. for 5 hours to prepare a resin composition (completely cured material).

Further, using the solution before coating on the biaxially oriented polyester film in the above, blue LEDs were encapsulated by potting, followed by heating at 100° C. for 2 hours and at 150° C. for 5 hours to prepare a LED device.

[Chem. 5]

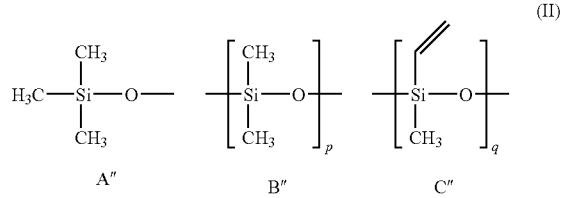

(II)

in which A", B" and C" are constitutional units, A" represents a terminal unit, B" and C" each represents a repeating unit, p is 32, and q is 8.

Comparative Example 2

The preparation of a resin composition and the production of a LED device were performed in the same manner as in Example 1, with the exception that 0.92 g (8.1 mmol) of allyl(glycidyl)ether was not used.

For the resulting completely cured materials and LED devices, characteristics thereof were evaluated according to the following test examples 1 to 5. The results thereof are shown in Table 1.

Test Example 1

Light Transmitting Property

The light transmittance (%) of each completely cured material at a wavelength of 450 nm was measured by using a spectrophotometer (U-4100, manufactured by Hitachi High-Technologies Corporation) to evaluate light transmitting property.

Test Example 2

Adhesiveness

An encapsulating material was peeled off from each LED device by using a push-pull gauge, and the load at that time was measured as adhesiveness. It is shown as the relative value at the time when adhesiveness of Comparative Example 1 is taken as 1.

Test Example 3

Light Resistance

An electric current of 450 mA was applied to each semiconductor device to light a LED element, and the luminance thereof immediately after the test was started was measured with an instantaneous multiple photometric system (MCPD-3000, manufactured by Otsuka Electronics Co., Ltd.). Then, the LED element was allowed to stand in a state where it was lighted, and the luminance after an elapse of 300 hours was similarly measured. The case where no change was observed compared to the luminance immediately after the test was started was evaluated as "A", and the case where a decrease in the luminance was observed was evaluated as "B".

Test Example 4

Heat Resistance

After measurement of the weight, each completely cured material was allowed to stand still in a hot air type dryer of 200° C., and the weight of the completely cured material after an elapse of 72 hours was measured. The percentage (%) of a value of the weight after heating divided by the weight before heating was calculated as the heat loss (%). The case where the heat loss was 5% or less was judged to show good heat resistance. Further, each completely cured material was allowed to stand still in a hot air type dryer of 200° C., and the appearance (heat discoloration resistance) of the completely cured material after an elapse of 24 hours was visually observed. The case where no change in color from a state before storage was observed was evaluated as "A", and the case where a change in color was observed was evaluated as "B".

Test Example 5

Mechanical Strength

The tensile elastic modulus of each completely cured material was measured by using an autograph (AGS-J, manufactured by Shimadzu Corporation) to evaluate mechanical strength. When the tensile elastic modulus was 5 MPa or more, it was judged to show a good mechanical strength

TABLE 1

| | | Example 1 | Example 2 | Example 3 |
|---|---|---|---|---|
| Composition | (1) Organohydrogenpolysiloxane | Compound of formula (I) in which R groups are all methyl groups (average molecular weight: 3,400) | Compound of formula (I) in which R groups are all methyl groups (average molecular weight: 3,400) | Compound of formula (I) in which R groups are all methyl groups (average molecular weight: 12,300) |
| | (2) Alkenyl Group-Containing Epoxy Compound Content (mmol) | Allyl (glycidyl) ether 8.1 | Allyl (glycidyl) ether 4.8 | Allyl (glycidyl) ether 8.1 |
| | (3) Alkenyl Group-Containing Cyclic Siloxane Content (mmol) | TVTMCTSi 4.1 | TVTMCTSi 4.6 | TVTMCTSi 4.1 |
| | (4) Hydrosilylation Catalyst | Pt-TMDS complex | Pt-TMDS complex | Pt-TMDS complex |
| | Alkenyl Group-Containing Compound Other Than the Above | — | — | — |
| SiH Group/Alkenyl Group of (2)[1)] | | 10/3.4 | 10/2 | 10/3.4 |
| SiH Group/Total Alkenyl Group[2)] | | 10/10 | 10/9.7 | 10/10 |

TABLE 1-continued

| Characteristics | | | | |
|---|---|---|---|---|
| Light Transmittance (%) | | 99 | 99 | 99 |
| Adhesiveness | | 4.5 | 3.9 | 4.4 |
| Light Resistance | | A | A | A |
| Heat Resistance (Heat Loss (%)) | | 4 | 3 | 3 |
| Heat Resistance (Heat Discoloration Resistance) | | A | A | A |
| Tensile Elastic Modulus (MPa) | | 9.8 | 11 | 8.5 |

| | | Example 4 | Comparative Example 1 | Comparative Example 2 |
|---|---|---|---|---|
| Composition | (1) Organohydrogenpolysiloxane | Compound of formula (I) in which R groups are all methyl groups (average molecular weight: 3,400) | Compound of formula (I) in which R groups are all methyl groups (average molecular weight: 3,400) | Compound of formula (I) in which R groups are all methyl groups (average molecular weight: 3,400) |
| | (2) Alkenyl Group-Containing Epoxy Compound Content (mmol) | Vinylcyclohexene oxide 8.1 | — | — |
| | (3) Alkenyl Group-Containing Cyclic Siloxane Content (mmol) | TVTMCTSi 4.1 | — | TVTMCTSi 4.1 |
| | (4) Hydrosilylation Catalyst | Pt-TMDS Complex | Pt-TMDS Complex | Pt-TMDS Complex |
| | Alkenyl Group-Containing Compound Other Than the Above | — | Compound of formula (II) (average molecular weight: 3,200) | — |
| SiH Group/Alkenyl Group of (2)[1)] | | 10/3.4 | — | — |
| SiH Group/Total Alkenyl Group[2)] | | 10/10 | 10/10 | 10/6.6 |
| Characteristics | Light Transmittance (%) | 98 | 99 | 99 |
| | Adhesiveness | 2.9 | 1 | 0.8 |
| | Light Resistance | A | A | A |
| | Heat Resistance (Heat Loss (%)) | 2 | 8 | 7 |
| | Heat Resistance (Heat Discoloration Resistance) | A | A | A |
| | Tensile Elastic Modulus (MPa) | 9.6 | 1.5 | 2.0 |

TVTMCTSi: 1,3,5,7-Tetravinyl-1,3,5,7-tetramethylcyclotetrasiloxane
Pt-TMDS Complex: Platinum-1,3-divinyl-1,1,3,3-tetramethyldisiloxane complex
[1)]SiH group/alkenyl group of (2) indicates the molar ratio (SiH group/alkenyl group) of SiH groups of the organohydrogenpolysiloxane and alkenyl groups of the alkenyl group-containing epoxy compound.
[2)]SiH group/total alkenyl group indicates the molar ratio (SiH group/total alkenyl group) of SiH groups of the organohydrogenpolysiloxane and total alkenyl groups of the alkenyl group-containing compounds contained in the composition.

The results show that the compositions of Examples are possible to provide the resin compositions excellent in light transmitting property, adhesiveness, light resistance and heat resistance and having a high mechanical strength, compared to those of Comparative Examples, and are the excellent encapsulation materials.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2009-050995 filed on Mar. 4, 2009, and the contents are incorporated herein by reference.

Also, all the references cited herein are incorporated as a whole.

The composition for a thermosetting silicone resin is suitably used, for example, at the time of producing a semiconductor device for back lights of liquid crystal screens, traffic signals, outdoor large-sized displays or billboards, and the like.

What is claimed is:

1. A composition for a thermosetting silicone resin, said composition comprising: (A) an organohydrogenpolysiloxane; (B) an alkenyl group-containing epoxy compound; (C) an alkenyl group-containing cyclic siloxane; and (D) a hydrosilylation catalyst,
wherein the (A) organohydrogenpolysiloxane is a compound represented by formula (I):

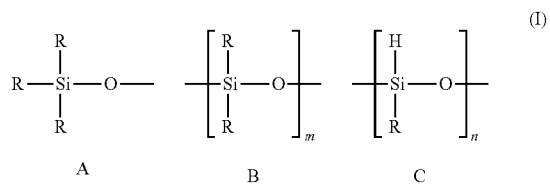

wherein A, B and C are constitutional units, A represents a terminal unit, B and C each represents a repeating unit, R represents a monovalent hydrocarbon group having 1 to 20 carbon atoms or hydrogen, m represents an integer of 0 or 1 or more, and n represents an integer of 2 or more, provided that all R groups may be the same or different.

2. The composition for a thermosetting silicone resin according to claim 1, wherein, in the (B) alkenyl group-containing epoxy compound, a molar ratio (alkenyl group/epoxy group) of alkenyl groups and epoxy groups is from 10/1 to 0.1/1.

3. The composition for a thermosetting silicone resin according to claim 1, wherein the (C) alkenyl group-containing cyclic siloxane is a compound having two or more alkenyl groups in the molecule thereof.

4. A thermosetting silicone resin composition obtained by reacting (A) an organohydrogenpolysiloxane with (B) an alkenyl group-containing epoxy compound under the presence of (D) a hydrosilylation catalyst, and then, further reacting the resultant reaction product with (C) an alkenyl group-containing cyclic siloxane under the presence of (D) a hydrosilylation catalyst, wherein the (A) organohydrogenpolysiloxane is a compound represented by formula (I):

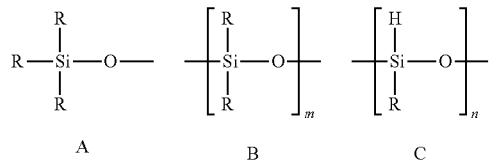

wherein A, B and C are constitutional units, A represents a terminal unit, B and C each represents a repeating unit, R represents a monovalent hydrocarbon group having 1 to 20 carbon atoms or hydrogen, m represents an integer of 0 or 1 or more, and n represents an integer of 2 or more, provided that all R groups may be the same or different.

5. A method for producing a thermosetting silicone resin composition, said method comprising: a step of reacting (A) an organohydrogenpolysiloxane with (B) an alkenyl group-containing epoxy compound under the presence of (D) a hydrosilylation catalyst; and a step of reacting the resultant reaction product with (C) an alkenyl group-containing cyclic siloxane under the presence of (D) a hydrosilylation catalyst, wherein the (A) organohydrogenpolysiloxane is a compound represented by formula (I):

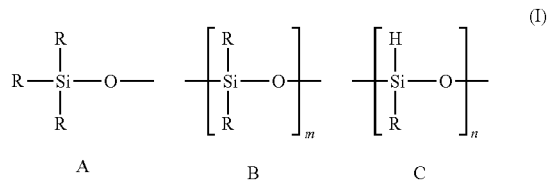

wherein A, B and C are constitutional units, A represents a terminal unit, B and C each represents a repeating unit, R represents a monovalent hydrocarbon group having 1 to 20 carbon atoms or hydrogen, m represents an integer of 0 or 1 or more, and n represents an integer of 2 or more, provided that all R groups may be the same or different.

6. A photosemiconductor element-encapsulating material comprising the thermosetting silicone resin composition according to claim 4.

7. A photosemiconductor device comprising a photosemiconductor element encapsulated with the thermosetting silicone resin composition according to claim 4.

8. A photosemiconductor device comprising a photosemiconductor element encapsulated with the photosemiconductor element-encapsulating material according to claim 6.

* * * * *